United States Patent [19]

Jensen

[11] 4,150,304
[45] Apr. 17, 1979

[54] CCD COMPARATOR

[75] Inventor: William E. Jensen, San Pedro, Calif.

[73] Assignee: Hughes Aircraft Company, Culver City, Calif.

[21] Appl. No.: 886,361

[22] Filed: Mar. 14, 1978

[51] Int. Cl.² .................. G11C 19/28; H01L 29/78
[52] U.S. Cl. ............................. 307/221 D; 357/24
[58] Field of Search .................. 357/24; 307/221 D

[56] References Cited

U.S. PATENT DOCUMENTS

| 3,777,186 | 12/1973 | Chang | 357/24 |
| 3,801,883 | 4/1974 | Tiemann | 357/24 |
| 3,906,542 | 9/1975 | Krambeck et al. | 357/24 |
| 3,919,564 | 11/1975 | Walden | 357/24 |

OTHER PUBLICATIONS

Kosonocky et al., "Basic Concepts of Charge-Coupled Devices", RCA Review vol. 36 (9/75), pp. 567-593.
Tiemann et al., "A Surface-Charge Correlator", IEEE J. Solid-State Circuits vol. SC-9 (12/74), pp. 403-410.
Heller "Bucket Brigade Charge Packet Diverter", IBM Tech. Disclosure Bulletin vol. 18 (1/76), pp. 2733-2734.
Sequin "Two Dimensional Charge-Transfer Arrays", IEEE J. Solid-State Circuits vol. SC-9 (6/74), pp. 134-142.
Sequin et al., "A Symmetrically Balanced Linear Differential Charge Splitting Input ...", IEEE Trans. Electron Devices, vol. Ed.-24 (6/77), pp. 746-750.

Primary Examiner—William D. Larkins
Assistant Examiner—Gene M. Munson
Attorney, Agent, or Firm—Martin E. Gerry; W. H. MacAllister

[57] ABSTRACT

A charge transfer device is provided having a first group of electrodes embedded in a semiconductor material and a second group of electrodes embedded in a contiguous overlying layer electrically insulating material. An improvement in this device includes means for injecting charge into such device having a number of additional components consisting of a first additional electrode which is embedded in-part in the semiconductor material, and a second additional electrode which is embedded in the insulating material. The first additional electrode is energized by a bias voltage and the second additional electrode is energized by a clock signal. In addition, a group of three electrodes, spaced apart from each other are embedded in the insulating material, and different voltages are applied to these three electrodes so as to create surface potentials and charge wells under certain of the electrodes at the interface of the semiconductor and insulating materials, and also to create potential barriers at each side of the charge wells.

11 Claims, 7 Drawing Figures

CCD COMPARATOR

BACKGROUND OF THE INVENTION

This invention is in the field of CCD devices, and more particularly in charge transfer devices used for comparing an input signal against a reference signal.

Although comparators using conventional electronic components are known in the art, no comparator is known which utilizes charge transfer principals.

SUMMARY OF THE INVENTION

A charge transfer device is provided having a group of electrodes embedded in a slab-like substrate of semiconductor material, and a second group of electrodes embedded in a contiguous layer of electrically insulating material. The device has means for injecting charge which comprises a first additional electrode embedded in-part in the semiconductor material, and a second additional electrode embedded in the insulating material. The first additional electrode is energized by a DC voltage and the second additional electrode is energized by a rectangular clock signal.

In addition to the above, the device utilizes three contiguous electrodes within the insulative material, substantially at the device center, with each of the two outer electrodes of the three contiguous electrodes having input voltages applied thereto. The electrode between the two outer electrodes has a ramp clock voltage applied thereto.

As a result of the applied voltages, surface potentials are created under these three contiguous electrodes. The surface potentials, in turn, give rise to a charge well located adjacent the electrode between the two outer electrodes at the surface interface between the semiconductor and insulator materials, and also give to two potential barriers, one barrier at each side of the charge well.

A substantial charge is injected into the charge well in a direction parallel to one of the sides of the charge well.

The ramp clock voltage then rises moving the potential at the bottom of the charge well towards the potential barrier, thus displacing upwards the fixed charge in the charge well. When the top of the charge in the charge well reaches the lowest potential of the two barrier potentials, charge will begin to flow over the barrier having the lower of the two barrier potentials into a low surface potential area so as to receive all the charge initially injected into the charge well.

Two outputs are provided so as to enable storing of charge in that particular one of the two low surface potential areas, referred to above. Logic complements therefore exist at two charge mode outputs provided by the device.

Power dissipation in the device is substantially in the area of the electrode between the two outer electrodes and in the area contiguous the electrodes to which the rectangular clock signal is applied.

DETAILED DESCRIPTION

Figure 1:
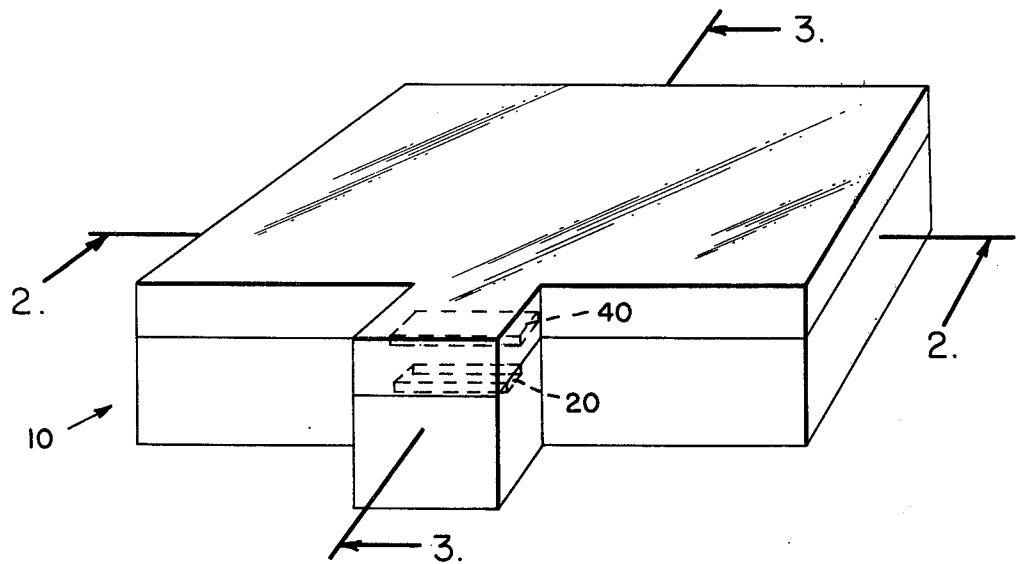
FIG. 1 is a top-plan view of the charge transfer device in accordance with the invention.

Referring to FIGS. 1-5 herein, a charge transfer (sometimes referred to as charge coupled) device 10 is provided for comparing a signal input with a reference signal.

Device 10 has a semiconductor body 12 generally of silicon, however other semiconductor materials such as germanium could have been utilized as body 12. Body 12 is shown as a P+ conductivity doped silicon material, however it is understood that other conductivity type materials, such as N types may be used.

Electrodes 14 spaced from each other and partially embedded within body 12 are hard wire interconnected and fed by DC potential $V_{dd}$ with respect to ground potential 11. Another DC voltage is powered by battery $V_s$ with the negative side of $V_s$ connected to substrate 12 at point 21, the positive side of battery $V_s$ being at ground potential 11. $V_s$ therefore provides a negative DC bias to substrate 12.

Electrodes 16 and 18 are spaced from each other and partially embedded within body 12. Electrode 16 has a hard wire connection for providing an output thereat and thereby providing a waveform output as shown at in FIG. 5. Electrode 18 has a hard wire connection for providing a waveform output as shown at B in FIG. 5. It is to be noted that waveforms A and B are not coincident.

An electrically insulating film 32 of $SiO_2$ is deposited over layer 12 and forms an interface at 22 with layer 12 and with the upper surfaces of each of electrodes 14, 16 and 18. It is understood that other insulating films may be used.

Gate electrodes 34, spaced from each other and embedded in film 32, are provided with hard wire connections to a terminal at $\phi_r$. The voltages at $\phi_r$ is illustrated as waveform C in FIG. 5 and consists of a series of rectangular pulses which provide a RESET function to device 10, thereby resetting outputs $Q_{out}$ and $\bar{Q}_{out}$ to $V_{dd}$ potential prior to recycling the operation performed by device 10.

Electrodes 36 and 38, bound within the confines of film 32 are spaced from each other in substantially a common plane and are respectively electrically connected to voltage sources 37 and 39 of power source 50. Voltages $V_i$ and $V_r$ shown in FIG. 5 as waveforms D and E, respectively, represent the input and reference voltages to the comparator, wherein $V_r$ represented by waveform E is a reference voltage having a specific reference level used to compare with $V_i$.

For the comparator of the present invention, the following truth table applies:

| Condition | $\overline{Q}_{out}$ | $Q_{out}$ |
|---|---|---|
| $V_i$ more positive than $V_r$ | 1 | 0 |
| $V_i$ less positive than $V_r$ | 0 | 1 |

Logic ONE (1) is defined herein as the presence of charge at output $\overline{Q}_{out}$ and $Q_{out}$. Logic ZERO (0) is defined herein as the absence of charge at these outputs. Logic ZERO has a more positive potential than logic ONE, and logic ONE has a potential less positive than the potential giving rise to logic ZERO level.

Electrode 42 is embedded substantially at the center of device 10 within film 32 at a plane substantially parallel to the plane in which electrodes 34, 36 and 38 lie. Electrode 42 is hard wire connected to a clock signal $\phi_w$ the waveform of which is shown at F, in FIG. 5, for ultimately transferring a charge in well 64 over either barriers 60 or 62 into adjacently located wells, to be hereinafter discussed. Waveform F need not be periodic in its repitition pattern, but under such circumstances the other waveforms namely G and C would have to be shifted in like amount of increase or decrease between one of the patterns of waveform F and another like pattern.

Figure 3:
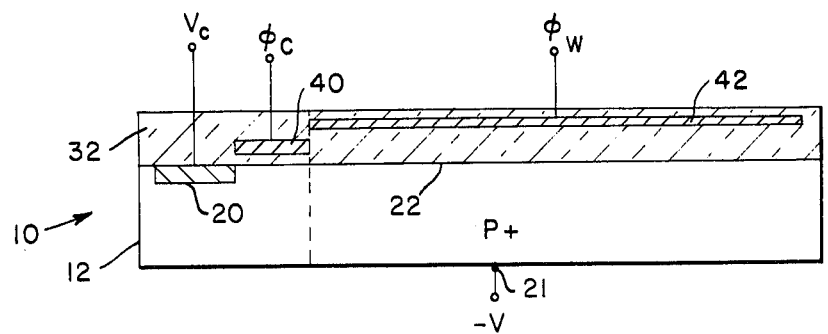
FIG. 3 is a cross-section view taken at plane 3—3 of FIG. 1 showing additional details of the device structure.

Referring to FIG. 3, electrode 20 is also partially embedded in semiconductor material 12, at one side of device 10, in transverse alignment with electrode 42. A DC voltage $V_c$ is coupled to electrode 20 by means of a hard wire connection. Alternatively, a clock voltage providing a repetitive rectangular waveshape may be used instead of voltage $V_c$, if desired.

Figure 4:
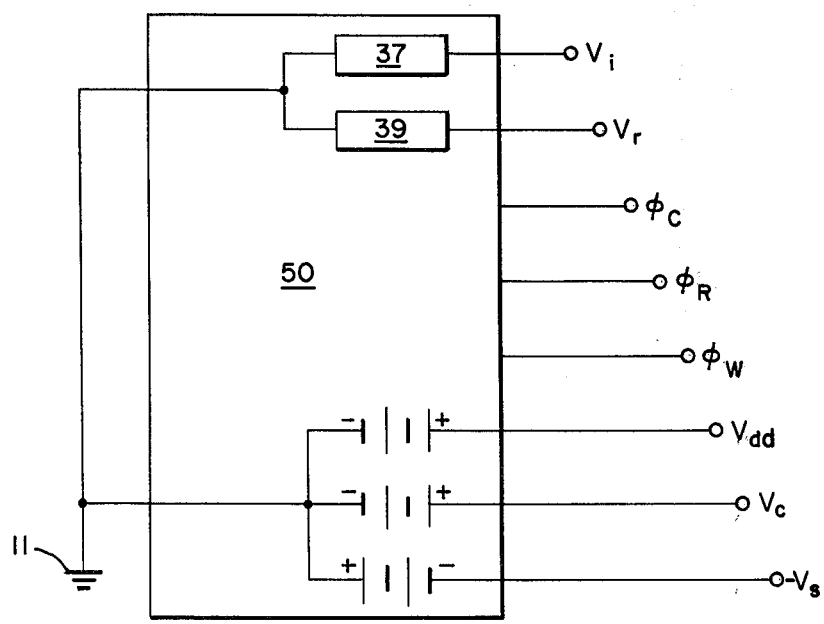
FIG. 4 is a block schematic showing various power sources, clock signals and input voltages used to feed the device, as well as showing input and reference voltages which are applied to the device.

It should be noted that voltages $V_{dd}$, $V_c$ and $V_s$ are provided by power source 50 shown in FIG. 4. Clock signals $\phi_w$, $\phi_r$ and $\phi_c$ are also provided by another section of source 50.

Electrode 40 is embedded within film 32 between electrodes 20 and 42 and has a hard wire connection so as to enable application of clock signal $\phi_c$ thereto as illustrated by waveform G. The structure of device 10 which includes electrodes 20 and 40, when combined with the remaining CCD structure hereinabove described, results in a novel means for injecting charge into device 10.

In order to further clarify the manner of operation of this device as a comparator it should be emphasized that the device utilizes three contiguous electrodes 36, 38 and 42 within the insulative material, substantially at the device center, with each of the two outer electrodes 36 and 38 of the three contiguous electrodes having input voltages $V_i$ and $V_r$ applied thereto respectively. The electrode 42 between the two outer electrodes 36 and 38 has a ramp clock voltage $\phi_w$ represented by waveform F applied thereto.

As a result of the applied voltages, surface potentials 60, 62 and 66 are created under these three contiguous electrodes. It should be noted that potentials 60 and 62 are also referred to as potential barriers. The surface potentials, in turn, give rise to a charge well 64 located under electrode 42 at the surface interface 22 between the semiconductor and insulator materials, which give rise to the two potential barriers 60 and 62, one barrier at each side of charge well 64.

A substantial charge is injected into the charge well 64 in a direction parallel to one of the sides of the charge well.

The ramp clock voltage $\phi_w$ then rises moving potential 66 at the bottom of the charge well 64 towards potential barriers 60 and 62, thus displacing upwards the fixed charge in the charge well to potential level 76. When the top of the charge at 76 in charge well 64 reaches the highest potential of the two barrier potentials 60 and 62, charge will begin to flow over the barrier having the higher of the two barrier potentials into a high surface potential area, either area 96 or 108, so as to receive all the charge initially injected into charge well 64.

Comparator operation is explained below in detail for substantially two possible cases of input voltages $V_i$ and $V_r$; that is, when $V_i$ is greater than $V_r$ and when $V_i$ is less than $V_r$. Those cases are explained in two comparator operations, first when $V_i$ is greater in potential level than $V_r$ during $t_0$–$t_8$ and then when $V_i$ is less in potential level than $V_r$ during period $t_8$–$t_{14}$. The case of inputs being equal provides equal outputs of one half of the normal output charge at 98 and 110, the sum of charges at 98 and 110 being equal to the charge in well 64.

Figure 2:
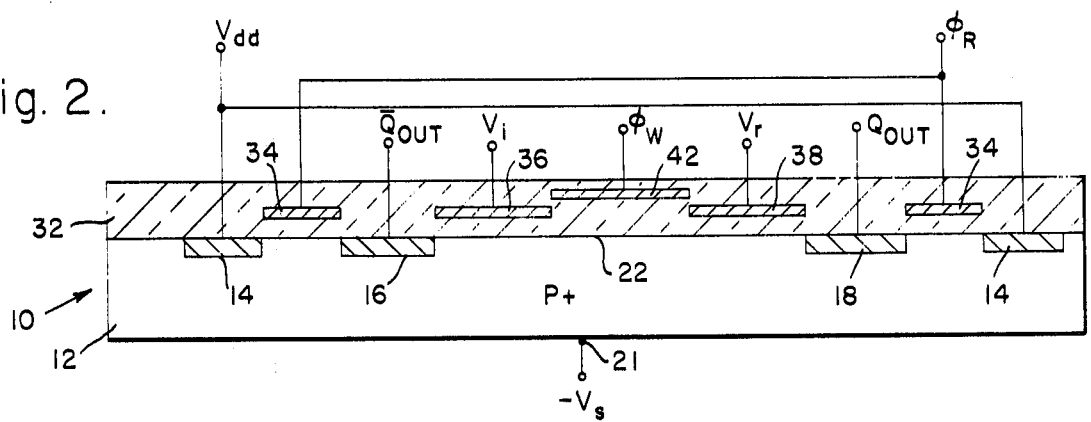
FIG. 2 is a cross-section view taken at plane 2—2 of FIG. 1 showing certain details of the device structure.
Figure 2A:
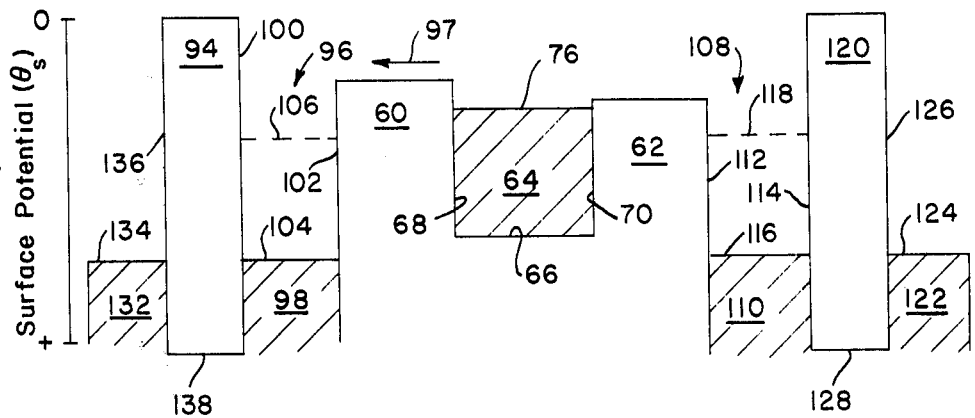
FIG. 2a is a surface potential diagram showing charge distribution in the various areas of the device as illustrated in FIG. 2.

Thus, before input voltage $V_i$ shown by waveform D changes at $t_8$ in the form of a step function, the direction of charge motion is in direction of arrow 97, FIG. 2a. Hence, complementary outputs ensue at $Q_{out}$ and $\overline{Q}_{out}$, resulting in comparator behaviour.

Figure 3A:
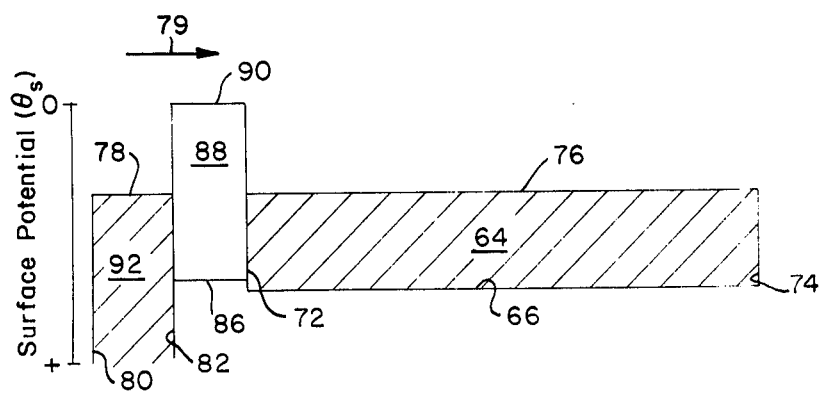
FIG. 3a is a surface potential diagram showing charge distribution in various areas of the device as illustrated in FIG. 3.
Figure 5:
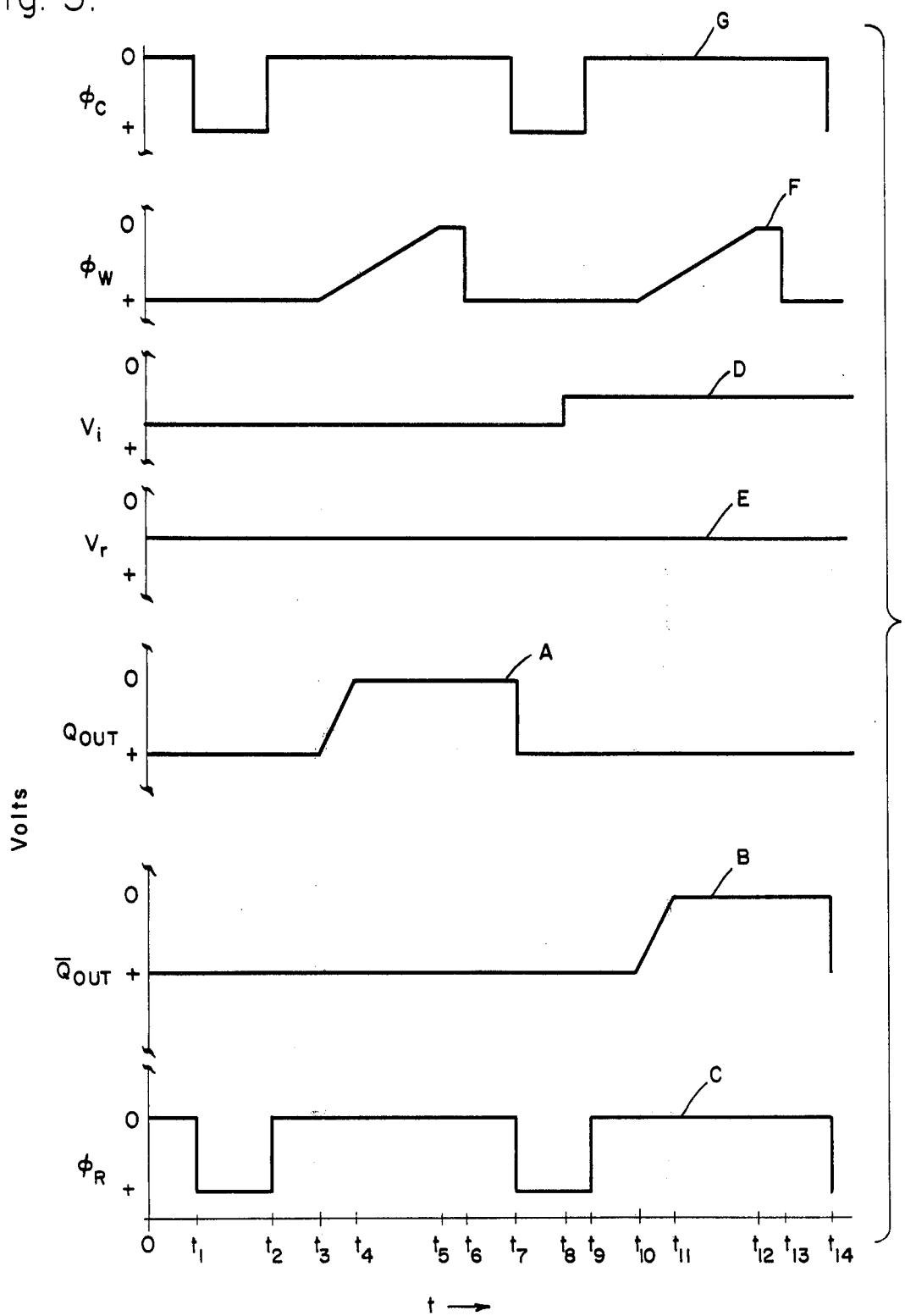
FIG. 5 is a waveform diagram showing the various clock signals and voltage input waveforms as well as logic outputs of the device, all drawn to a common time base.

Referring particularly to FIGS. 2a and 3a, device 10 may be functionally described in terms of its potential profiles and waveforms A through G shown in FIG. 5.

Just prior to time $t_1$, waveform G representing clock $\phi_c$, created a barrier 88 at a potential level 90, as shown in FIG. 3a as being zero potential. At time $t_1$, $\phi_c$ undergoes a transition changing the barrier to potential level 86 which is at a more positive potential level as compared with potential level 90.

At time $t_1$, waveform G representing clock $\phi_c$ which previously had created barrier 88 at potential level 90, in FIG. 3a, now changes to potential level 86. At potential level 90, the device is turned OFF because the surface potential $\phi_s$ at 22 is ZERO.

During the period $t_1$–$t_2$, waveform G provided by clock $\phi_c$, is most positive, which condition turns device 10 ON rather quickly providing a low ON-operational mode resistance, thus permitting rapid charging of well 64, previously depleted of charge, from level 66 to level 76 by virtue of the presence of charge 92 at level 78. Therefore, charge transfer direction occurs from left to right as indicated in FIG. 3a by arrow 79.

At $t_2$, $\phi_c$ as shown by waveform G, switches to ZERO volt level, turning OFF the source of charge and thereby disabling the flow of charge into well 64.

During periods $t_3$–$t_5$, the $\phi_w$ clock potential shown by waveform F, provides a charging ramp waveform from a positive to a ZERO potential. The charge in well 64 is bounded by wall 68 of barrier 60 and wall 70 of barrier 62 as well as walls 72 and 74. The bottom of well 64 is defined by a potential at 66. Clock $\phi_w$ defines potential 66 at the bottom of well 64. Waveform G transition shifts the bottom of well 64 thus displacing surface potential 76 to a less positive direction until such time as potential 76 is equal to the more positive of barriers 60 or 62, during period $t_3$–$t_5$. Voltage $V_i$ at that period is more positive than voltage $V_r$ with respect to ground 11, as the ramp of waveform F continues to change to a less positive potential and the charge in well 64 will be transferred as shown by arrow 97 to well 96 over barrier 60, as clock $\phi_w$ continues to change to a less positive potential. Such potential change thereby increases charge 98 already in well 96, from level 104 to level 106. Well 96 is defined by wall 100 of barrier 94, wall 102 of barrier 60 and by potential charge level at 104. The surface potential at level 106 in indicating the presence of charge thereat in well 96 defines logic ONE for the $Q_{out}$ which exists at time $t_4$ and remains in logic ONE state until time $t_7$.

During period $t_5$–$t_6$, there is no change in $\phi_w$ signal and no change in operation of the device occurs and hence this time period is not critical to CCD operation.

At time $t_6$, $\phi_w$ makes a transition from ZERO voltage to its original positive voltage in readiness for the next-in-sequence comparison period.

The function of barrier 94 is to disconnect or turn OFF the reset mechanism, consisting of gate electrodes 34 and electrode 14, during period $t_2$–$t_7$. Barrier 94 is bounded by potential 95, wall 100 and wall 136 thereof.

At $t_7$, waveform G switches from ZERO to a positive voltage thereby switching the potential level at 95 to the level shown at 138. Such switching produces a low resistance path between well 96 and potential level $V_{dd}$ and 134 thereby providing the required mechanism to reset well 96 from level 106 to level 104 which is at the same potential level as shown at 134.

It should be noted that potential area 132 is created by a DC voltage $V_{dd}$ and is not a well because charge cannot be stored thereat since the 132 area is essentially a charge drain or sink. This is also true for areas 92 and 122.

During $t_7$–$t_9$, output wells at 96 and 108 are reset to $V_{dd}$ potential, coincident with the presetting of well 64 which restarts the operational cycle of the device in the same manner described hereinabove in connection with period $t_1$–$t_2$.

It may be noted that input signal $V_i$ at $t_8$ is illustrated to show the change in voltage level the purpose of which is to illustrate the operation of the device as a comparator wherein an input signal $V_i$ is less positive than reference input signal $V_r$.

Hence, during time period defined by $t_7$–$t_{14}$, the charge in well 64 is now transferred in the opposite direction over barrier 62 into well 108 thereby providing a logic ONE output at $Q_{out}$, between $t_{11}$–$t_{14}$, in accordance with the foregoing truth table. Consequently, numerical identifiers 108, 110, 112, 114, 116, 118, 120, 121, 122, 124, 126 and 128 may be defined in the same terms as heretofore defined and described in connection with numerals 96, 98, 102, 100, 104, 106, 94, 95, 132, 134, 136 and 138 respectively.

What is claimed is:

1. A charge transfer device having a first group of electrodes embedded in a semiconductor material and a second group of electrodes embedded in a contiguous layer of overlying electrically insulating material, said semi-conductor and insulating materials forming an interface, the improvement comprising:
   first means embedded within the semiconductor and insulating materials for enabling the injection of charge into said device, said first means including a first electrode embedded in-part in the semiconductor material and energized by a bias voltage, and including a second electrode embedded in the insulating material and energized by a clock signal;
   second means, embedded in-part in the semiconductor material, for receiving charge injected thereunder at said interface; and
   third means embedded in the insulating layer and having a saw-tooth voltage applied thereto so as to provide a charge well thereunder at said interface, said saw-tooth voltage changing the well potential, said third means having a length extending substantially totally across one of the dimensions of the layer parallel to said interface, said length being the longest dimension of said third means, said first means injecting a substantial charge into the charge well along a direction parallel to said length.

2. A charge transfer device having a first group of electrodes embedded in a semiconductor material and a second group of electrodes embedded in a contiguous layer of overlying electrically insulating material, said semiconductor and insulating materials forming an interface, comprising the combination of:
   first means embedded within the semiconductor and insulating materials for enabling the injection of charge into said device, said first means including a first electrode embedded in-part in the semiconductor material and energized by a bias voltage, and including a second electrode embedded in the insulating material and energized by a clock signal;
   second means, embedded in-part in the semiconductor material, for receiving charge injected thereunder;
   third and fourth means spaced apart from each other and embedded in the insulating material substantially in a common plane having input voltages applied thereto being compared with each other; and
   fifth means, embedded in the insulating material in a plane different from said common plane intermediate the third and fourth means, having a saw-tooth voltage applied thereto for providing a charge well thereunder at said interface and for changing the well potential.

3. The invention as stated in claim 1, wherein the bias voltage is DC.

4. The invention as stated in claim 2, wherein the saw-tooth voltage is periodic.

5. The invention as stated in claim 2, wherein said third, fourth and fifth means provide potential barriers at each side of the charge well.

6. The invention as stated in claim 2, wherein said fifth means has a length extending substantially totally across one of the dimensions of the layer parallel to said interface, said length being the longest dimension of said fifth means, and wherein said first means provides the capability of injection of a substantial charge into the charge well along a direction parallel to said length.

7. The invention as stated in claim 2, including device output terminals for providing voltage outputs from said device at said terminals.

8. The invention as stated in claim 2, including device output terminals for providing charge mode logic complements from said device at said terminals.

9. A charge transfer device having a semiconductor slab and an electically insulating layer disposed on the slab, said slab and layer forming an interface, comprising the combination of:
   a voltage reference source and a variable voltage source providing input potentials to said device;
   first means, embedded in said layer, connected to the reference source for providing a reference potential to said device;
   third means, partially embedded in said slab, for providing a first output logic state from said device when the input potential is more positive than the reference potential and for providing a second output logic state from said device when the input potential is less positive than the reference potential;

fourth means embedded within the semiconductor and insulating materials for enabling injection of charge into said device; and fifth means, within the insulating layer, having a length extending substantially totally across one of the dimensions of the layer parallel to said interface, said length being the longest dimension of said fifth means, said fifth means providing a charge well thereunder at said interface, and wherein said fourth means provides the capability of injection of a substantial charge into the charge well along a direction parallel to said length, said fifth means having a saw-tooth voltage input applied to said device so as to gradually change the well potential.

10. The invention as stated in claim 9, including sixth means, partially embedded in the semiconductor slab, lying substantially in the same plane as the third means for enabling application of a bias voltage to said device.

11. The invention as stated in claim 9, including a DC source connected to the semiconductor slab for providing a negative DC potential to said slab.

* * * * *